(12) United States Patent
Staib

(10) Patent No.: US 6,492,644 B1
(45) Date of Patent: Dec. 10, 2002

(54) DEVICE AND METHOD FOR ENERGY AND ANGLE-RESOLVED ELECTRON SPECTROSCOPY

(75) Inventor: Philippe Staib, Langenbach (DE)

(73) Assignee: Staib Instrumente GmbH (DE)

( * ) Notice: Subject to any disclaimer, the term of this patent is extended or adjusted under 35 U.S.C. 154(b) by 215 days.

(21) Appl. No.: 09/598,612

(22) Filed: Jun. 21, 2000

(30) Foreign Application Priority Data

Jun. 25, 1999 (DE) .......................................... 199 29 185

(51) Int. Cl.[7] ............................ H01J 49/00; H01J 37/00
(52) U.S. Cl. .................... 250/396 R; 250/287; 250/305
(58) Field of Search ................................ 250/287, 305, 250/396 R, 397, 398, 399, 400, 492.1, 492.21, 492.3

(56) References Cited

U.S. PATENT DOCUMENTS

| 4,764,673 | A | * | 8/1988 | Bryson, III et al. ......... 250/305 |
| 5,654,543 | A | * | 8/1997 | Li ............................... 250/287 |
| 5,689,111 | A | * | 11/1997 | Dresch et al. .............. 250/287 |
| 5,757,009 | A | * | 5/1998 | Walstrom ............... 250/396 R |
| 6,198,095 | B1 | * | 3/2001 | Staib .......................... 250/287 |

FOREIGN PATENT DOCUMENTS

| DE | 28 26 604 A1 | 1/1980 |
| DE | 197 01 192 A1 | 7/1998 |
| EP | 0 669 635 A2 | 8/1995 |
| JP | 58-78361 A | 5/1983 |

OTHER PUBLICATIONS

Strong, R.L. et al, "New lens system for surface vibrational spectroscopy at high impact energies" IN "Rec. Sci. Instr.", vol. 55, No. 8, 1984, p. 1304–1309.
Boesten, L. "Modified operation of the seven–element electrostatic Chutjian–Kuyatt lens system" in "Rev. Sci. Instr.", vol. 59, No. 2, p. 233–237.
Y. Horio "Zero–Loss Reflection High–Energy Electron Diffraction Patterns and Rocking Curves of the Si(111) 7×7 Surface Obtained by Energy Filtering" in "Jpn. J. Appl. Phys.", vol. 35, 1996, p. 3559–3564.

* cited by examiner

Primary Examiner—John R. Lee
Assistant Examiner—David A. Vanore
(74) Attorney, Agent, or Firm—Schnader Harrison Segal & Lewis LLP

(57) ABSTRACT

A device for imaging a beam of particles composed of charged particles with a certain energy and angle distribution on a detector device using a device, including a deflection unit with at least one deceleration lens provided for forming essentially parallel particle paths in the particle beam, whose reciprocal distances correspond to the angle distribution of the particles, and a filtering unit, which is located between the deflection unit and the detector facility, whereby the filtering unit may be biased with a potential for formation of a braking field and is adapted to be energy-selectively permeable for the particles, on the sample side before the deflection unit, an entry window in the form of an axial-symmetrical staged aperture or an entry grid is located, which is electrically separated from the deflection unit and at ground potential.

16 Claims, 11 Drawing Sheets

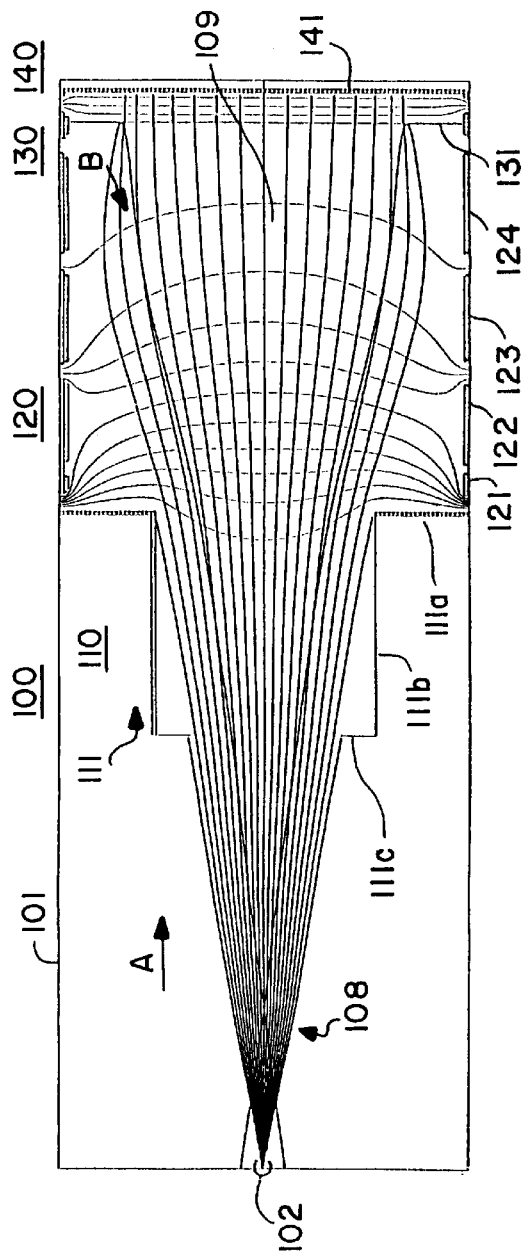
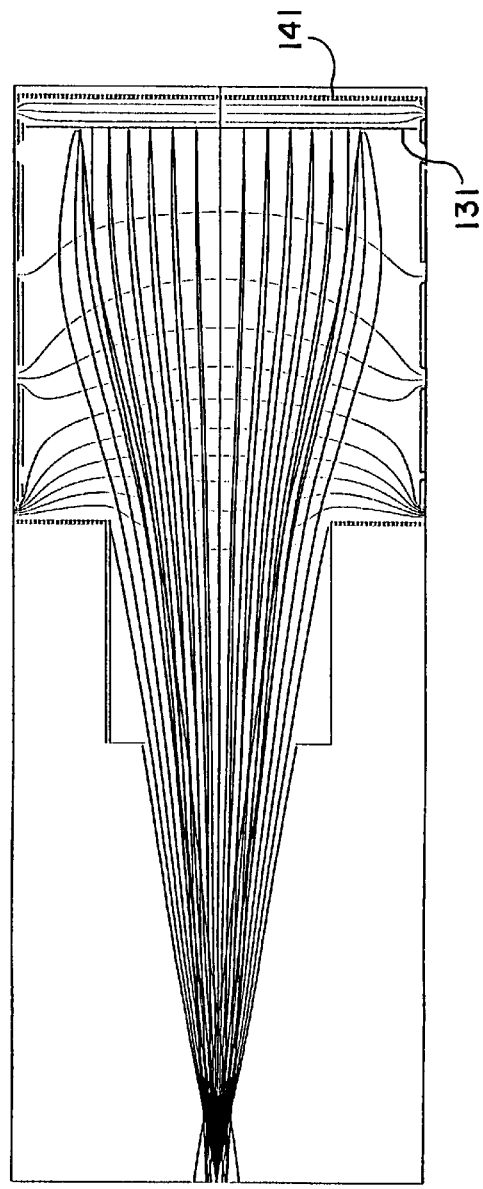

100

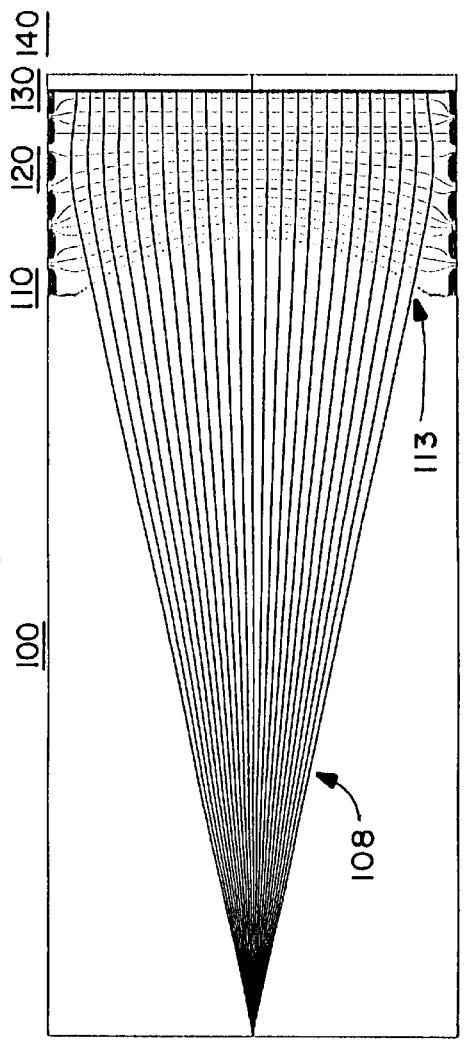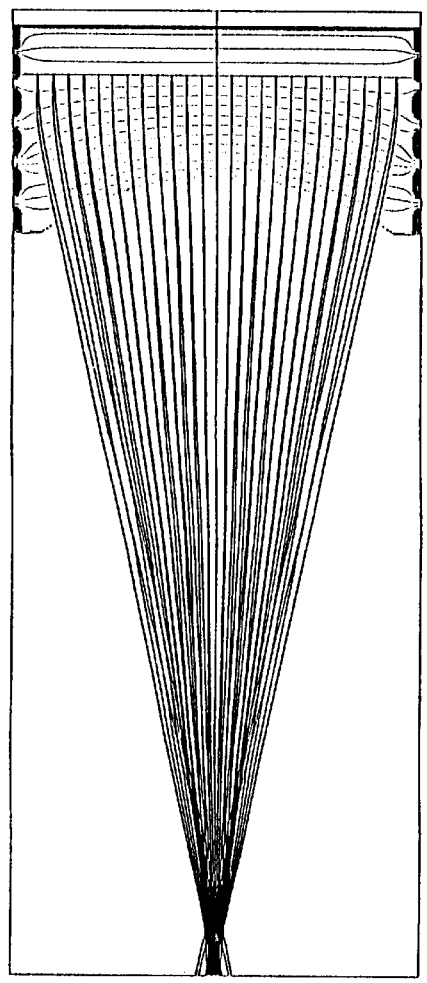

DEVICE AND METHOD FOR ENERGY AND ANGLE-RESOLVED ELECTRON SPECTROSCOPY

FIELD OF THE INVENTION

The invention concerns devices and methods for imaging of a beam of particles composed of charged particles with a certain energy and angle distribution on a detector, and a spectrometer, especially for electron diffraction measurements, with energy and angle resolution.

PRIOR ART

When irradiating a material sample with electromagnetic radiation or charged particles, due to interaction in the sample, radiation of charged particles may happen, whose spatial (or angular) and energy distribution allow drawing of conclusions concerning physical or chemical processes in interaction or characteristics of the participating particle types or the interaction region. Numerous analysis methods have been developed on this basis, for instance using electron diffraction examinations or spectroscopic examinations.

A problem of the known analysis methods is simultaneous recording of angular and energy distribution of a particle beam (consisting e. g. electrons, ions or ion groups, atoms or atom groups). For instance, in the investigation of reflection of high energy electrons from a sample (RHEED method), there is interest in energy-filtered recorded diffraction images to be able to separate elastic and non-elastic scattering processes. Modeling of purely elastic scattering enables an improved structural resolution.

In DE-OS 197 01 192, conventional systems for simultaneous local and energy resolution for investigation of electron diffraction are explained. As a first embodiment, a scanning mechanism is implemented which enables scanning of sections of the diffraction image and its energy analysis are described, but is interference-prone and time-consuming, so that specifically realtime analyses, for instance for observation of surface changes on solids, are possible only in a limited manner or not at all. Real simultaneous energy and angle resolution is only achieved with a second embodiment, in which a diffraction pattern is viewed through pairs or triplets of filters (generally: groups of filtering electrodes). Predetermined deceleration fields are formed between the filtering electrodes, which for instance are passed by elastically scattered electrons and which reflect the non-elastic scattered electrons.

For realization of the second embodiment, for instance by Y. Horio, in "Jpn. J. Appl. Phys. ", Vol. 35, 1996, p. 3559 ff., filtering electrodes in the form of sphere-shaped grids are described, but these are disadvantageous due to the necessarily small working distance, the small energy resolution and sensitivity with respect to contamination. In contrary to this, according to DE-OS 197 01 192 (see FIG. 16), improvement was achieved by use of filtering electrodes in the form of plane grid electrodes 3, 4 and the combination of such filtering electrodes with a deflection unit 1 for formation of parallel electron beams, whose mutual distance corresponds to angular distribution of the electrons and which are directed to the filtering electrodes. Using this combination of parallel electron paths with plane filtering electrodes, the above mentioned disadvantages of the technology according to Y. Horio with respect to the working distance of the detector 2 from the sample, the sensitivity and robustness of the imaging device can be overcome. For measuring tasks with extreme requirements, the imaging quality (highly resolving electron diffraction), for which for instance the distance of diffraction maximums must be measured with high precision, restricting image distortions occur also in case of the technology with plane filtering electrodes.

The image distortions for conventional energy-selective imaging are especially caused by inhomogenous scatter angle focusing and by interfering moirépatterns at the grid-shaped filtering electrodes 3, 4. The limited quality of scatter angle focusing leads to the fact that especially in case of larger scatter angles the correspondence between the distance between the parallel partial beams and the angle distribution of the scattered electrons is no longer linear. Depending on the application, the image size and/or the resolution of the image is limited by this.

OBJECT OF THE INVENTION

The object of the invention is to provide improved devices and methods for angle and energy resolving imaging of a particle beam, which are characterized by increased imaging quality, in particular by extended scattering light images and/or higher resolution of the images. It is furthermore the object of the invention to provide a correspondingly designed spectrometer and method for its operation and use.

SUMMARY OF THE INVENTION

A first important aspect of the invention is the provision of an imaging device for energy and angle selective imaging of charged particles, for instance electrons, with a preceding entrance aperture or a preceding entrance grid oriented transversely to the particle beam. The entrance grid is electrically insulated with respect to the deflection unit and is preferably at ground potential. It serves to limit the electric field caused by the deflection unit on the sample side and allows better edge beam control. Edge beam control means that the linearity of the correspondence between scattering angles and distances between the parallelized particle trajectories also in case of larger scattering angles up to the image edges is assured. According to a first embodiment, the entrance grid is a grid being essentially planar, standing vertically on the axis of the deflection unit, which is preferably adapted for imaging of larger scattering angle ranges of up to +/−10°. But if, depending on the application, the highest linearity (minimal distortion) is more important for imaging, then according to a second embodiment of the entrance grid, it is provided as a sphere-shaped grid. As a sphere-shaped grid, the entrance grid has the shape of a section of a sphere surface with an associated predetermined sphere radius.

Another important aspect of the invention consists in further improving a device according to the invention for energy and angle resolved imaging of a beam of charged particles on a detector device on the basis of the above mentioned combination of a deflection unit for creation of parallel and decelerated particle beams and a filtering device to the extent that the filtering device consists of a single filtering grid aligned vertically with respect to the parallel particle beams. This means that between the deflection unit and the detector device only one filtering grid electrode is located, extending transversely to the particle beams, and the space between the deflection unit and the detector device is otherwise free of further beam shaping electrodes. The filtering grid in association with the deflection unit forms a retarding field analyzer, which for instance serves to filter nonelastically scattered electrons for electron diffraction investigations.

The transition from a group of filtering electrodes to a single filtering grid forms an important advantage, especially in interaction with a preceding entrance grid, with respect to simplification of the overall installation as well as with respect to imaging quality. The inventor surprisingly found that using the filtering grid the same highly sensitive energy selectiveness may be achieved as using the conventional imaging device, but no moirépatterns are created and therefore the imaging quality is improved.

The invention also relates to a spectrometer, in particular an electron diffraction spectrometer being provided with the imaging device described above. Preferred applications of such a spectrometer are in electron diffraction investigations for all usual energy levels (LEED, MEED, HEED, corresponding to low, medium, high energy electron diffraction, respectively), for energy and angle resolved ion scattering investigations, for structural analysis by elastic scattering and non-elastic diffusion (for instance on the basis of Kikushi lines) or for angle resolved electron spectroscopy. The use of the imaging device according to the invention is not limited to use in diffraction spectrometers. A device according to the invention may also be used as an electronic mirror for the so-called "time-of-flight" spectroscopy.

The invention furthermore relates to a method for imaging of a particle beam consisting of charged particles with a specific energy and angle distribution on a detector unit for which the particles are shaped into parallel and decelerated particle beams or trajectories using a deflection unit and are directed to a filtering grid, which in interaction with the deflection unit lets particles pass energy selectively having an energy level above a certain cut-off energy to a detector and reflects particles at a lower energy level. According to a preferred embodiment of the invention, the particles before entrance into the deflection unit pass through a field-free space on the sample side, which is shielded against the deflection unit by a plane or sphere section shaped entrance grid.

The invention offers the advantages of extremely improved energy resolution, which for instance for 10 keV electron energy level amounts to about 2 eV. Furthermore, the imaging properties are substantially improved with respect to conventional devices, which is shown specifically in a reduction of distortion for imaging of diffraction maximums. Further advantages result from the simplified structure of the imaging device according to the invention, the freedom of the image from distortion (improved scatter angle focusing) and extension of imaging dimensions (enlargement of the scattering angles able to be imaged in evaluation).

BRIEF DESCRIPTION OF THE DRAWINGS

Further details and advantages of the invention are described below with reference to the enclosed drawings. These show:

FIG. 1 a first embodiment of an imaging device according to the invention in schematic cross section, FIG. 2 an illustration of the device according to FIG. 1 in case of complete reflection of the particle beams, FIG. 3 an illustration of the focusing properties characteristics of the device according to FIG. 1 in case of different scattering angles, FIG. 4 a further embodiment of an imaging device according to the invention with a plane entrance grid in schematic cross section, FIG. 5 an illustration of the device according to FIG. 4 in case of complete reflection of the particle beams, FIG. 6 an illustration of the focusing characteristics of the device according to FIG. 5 in case of different scattering angles, FIG. 7 a further embodiment of an imaging device according to the invention with a sphere-shaped bent entrance grid in schematic cross section, FIG. 8 an illustration of the focusing characteristics of the device according to FIG. 7 in case of different scattering angles, FIG. 9 a further embodiment of an imaging device according to the invention with a sphere-shaped bent entrance grid in schematic cross section, FIG. 10 an illustration of the device according to FIG. 9 in case of complete reflection of the particle beams, FIG. 11 an illustration of the focusing characteristics of the device according to FIG. 9 in case of different scattering angles, FIG. 12 a graph display for illustration of distortion as function of the scattering angle for the embodiments of the invention illustrated in the FIGS. 1 through 11, FIG. 13 an illustration of energy filtering of a diffraction image, FIG. 14 a graph display for illustration of an energy loss measurement using a silicon sample, FIG. 15 a schematic overview of a RHEED device furnished with a spectrometer according to the invention, and FIG. 16 a cross section of a conventional electron beam imaging device (prior art).

The invention is described below by example with reference to a device for imaging of electron beams of a specific energy and angle distribution, but is not limited to imaging electrons. It is also applicable for imaging of other charged particles.

Figure 3:
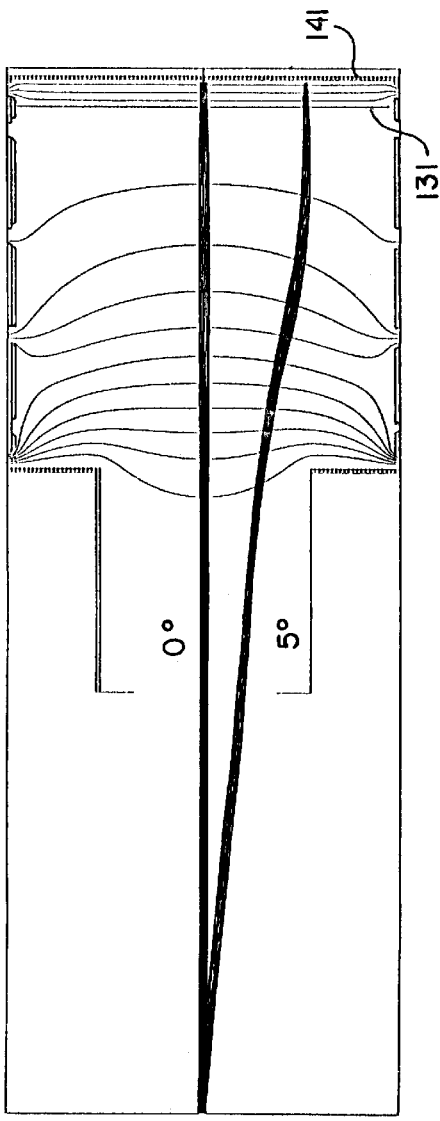

FIGS. 1 through 3 in schematic cross section show an imaging device 100 according to the invention for energy and angle resolved imaging of an electron beam 108, whereby for reasons of clarity only the imaging stages located in a housing 101 are shown.

The imaging stages in detail include an entrance section 110, a deflection unit 120, a filtering device 130 and a detector device 140. The housing 101 in shape of a straight circular cylinder furthermore contains holding devices for mounting the components stated inside of the housing, electrical connections for subjecting the components to the desired control voltage and for obtaining of imaging signals from the detector device 140 and outside holding devices for fastening the housing 101, for instance to a spectrometer. But these parts are known and therefore not illustrated in detail. The geometric dimensions of the imaging device 100 are selected application-dependent and are for instance in the range of about 5 cm to 15 cm for the housing diameter and 0.5 to 1.5 times the housing diameter for the axial length of the imaging stages. The optical axis of the device 100 coincides with the cylinder axis of the housing 101.

The entrance section 110 is formed by an entrance window 111 in the shape of a staged aperture in the embodiment of the invention shown. The entrance window 111 is preferably at ground potential, so that on the sample side before the imaging device 100 a field-free space is formed, and serves to fade out portions of the electron beam 108 with large scattering angles. For instance, fading out of scattering angles above +/−6° is provided. The staged composition of the entrance window 111 includes an axial-symmetrically mounted ring aperture part 111a, an axial extending cylinder-shaped part 111b and another ring aperture part 111c mounted on its sample side end. The staged composition enables partial extension of the electrical fields of the deflecting unit 120 on its sample side.

The deflecting unit 120 for the embodiment shown includes four deceleration lenses 121, 122, 123, and 124. Alternately, less (at least one) or more deceleration lenses may be provided for. The deceleration lenses are mounted axial-symmetrically on the inside of the housing 101 and are preferably shaped as sheet metal rings. Dimensioning and control of the deceleration lenses 121–124 is selected to be application-dependent. Either, for each deceleration lens a separate connector for biasing with a variable control voltage is provided for, or for all deceleration lenses a joint connecting device and fixed dividing stages for setting the control voltages of the individual deceleration lenses.

In the filtering device 130, exclusively one filtering grid 131 is provided for, which is mounted inside of the housing 101 between the last deceleration lens 124 in direction of the incoming electron beam 108 and the detector device 140. The filtering grid 131 is a plane grid extending vertically to the housing axis across the whole entrance section of the electron beam 108 formed by the entrance window 111 and the deceleration lenses 121–124. The grid preferrably has a high transmission of about T =90% and is formed by a rectangular or slant angled stripe or wire grid.

The detector unit 140 includes a fluorescent screen 141, which interacts with a suitable sensor(s) (not shown). The sensor may be a CCD camera, a photodiode and/or an electron multiplier. The fluorescent screen 141 for avoidance of static electricity is preferably built including an electrically conductive material. For very sensitive measurements with low currents, the fluorescent screen 141 may be replaced by channel-plate electron multiplier, behind which an adapted fluorescent screen is mounted.

During operation, an electron beam 108 emitted from the sample 102 schematically illustrated in FIG. 1 at the left edge of the figure enters the deflecting unit 120 through the entrance window 111. The electron beam 108 is a bundle of electrons which after scattering at the sample surface form divergent particle trajectories. In the drawing, the trajectories are shows as lines, which have a stage in the scattering angle of 1° per line resp. The section of the angle distribution the entrance window 111 lets pass for scattering angles below +/−6° forms an electron current distribution through a reference plane standing vertically on the housing axis. The electrons move in the direction of the arrow A under the influence of the electrical fields provided by the deceleration lenses 121–124, whereby an electron beam 109 with essentially parallel, straight particle trajectories is formed. The electrons are decelerated down by in beam direction increasing counter potentials of the deceleration lenses. The electron beam 109 forms an electron beam distribution corresponding to the original angle distribution through a reference plane, vertically to the travelling direction A, whereby for large scattering angles large distances to the housing axis and for small scattering angles smaller distances to the housing axisa are formed.

The deceleration lenses therefore fulfill a dual function. On the one hand, the stated parallel particle trajectories (so-called "parallel diffraction image") are formed. On the other hand, the electrons are decelerated, whereby deceleration is preferably so strong that the electrons when passing the last deceleration lens 124 have as low an energy level as possible. This achieves improved energy resolution at the filtering grid 131. For instance, deceleration by about 90% is strived for, whereby an about 10-fold improvement of the energy resolution is achieved.

The stationery potentials with which the deceleration lenses 121–124 are biased may be calculated on the basis of electro-statics (for instance on field distribution of individual lenses) depending on the concrete construction and the required precision or determined by using suitable numerical simulations. Specifically the requirements that the particle trajectories should be in parallel and strongly slowed down after passing through the deflection unit 140 serve as input values. For parallelization, for instance, a divergence of the particle trajectories of less than 0.5° is considered as a condition for the simulation. A further condition consists of the setting of a linear angle deviation. This means that the linear connection between the scattering angle and the distance of the respective particle trajectory to the cylinder axis should be preserved even for large scattering angles. This minimizes the imaging fault named pincushion distortion (negative distortion). Determination of the potentials of the deceleration lenses by calculation or numerical simulation is also performed for the changed embodiments of the invention explained below.

After passing the deceleration lens 123, electrons hit the filtering grid 131, which is biased in such a form with a potential difference (filter deceleration potential) with respect to the deceleration lens 124 for formation of a deceleration field, so that electrons with an energy level below a predetermined cut-off energy are reflected into the particle beam (see arrow B) and only particles with a higher energy are allowed to pass to the detector 140. The achievable sensitivity of the energy selectivity depends on the embodiment of the filter grid 131 and the operating parameters, especially the strength of the deceleration field and the size of the grid openings (mesh size).

To achieve a high imaging quality, at the filtering grid 131, grid openings of about 300 $\mu$m or lower are preferred.

Electrons with sufficiently high energy level pass through the grid openings of the filtering grid 131 and hit the fluorescent screen 141. An accelerating potential may be provided between the fluorescent screen 141 and the filtering grid 131.

Example values for the potentials of the deceleration lenses 121–124 are −6 kV, −9 kV, −9.4 kV and −10 kV, respectively. The field grid 131 is at a potential of −7 kV.

The electron trajectories shown in FIGS. 1 and 2 show the filtering effect of the imaging device 100 according to the invention. According to FIG. 1, the electrons of the electron beam have an energy level of 10001 eV. Besides the partial beams with high scattering angle (+/−6°), which do not contribute to fault-free image and are therefore reflected at the filtering grid 131, all electrons pass through the filtering grid 131 to the fluorescent screen 141. But if all electrons according to FIG. 2 only have an energy level of 9999 eV, then all electrons are reflected at the filtering grid 131 and turned back into the imaging device. FIGS. 1 and 2 illustrate the excellent energy resolution of about 2 eV for an electron energy level of about 10 keV.

FIG. 3 illustrates another advantage of the invention, namely the excellent scattering angle focus for different scattering angles of the electron beam of 0° and 5°, respectively. In the case of an electron beam extension $\delta x$ at the sample location, for instance an extension on the fluorescent screen 141 with a dimension in the range of $\delta x/5$ to $\delta x/10$ is achieved.

A specific advantage of the filtering grid 131 consists in the focusing effect of the grid openings. Due to slight field punch-through through the grid openings, these form respective small electro-optical lenses. This focusing effect only occurs for electron energy levels of about 2 to 6 eV, i.e. for already decelerated, slow electrons.

Figure 4:
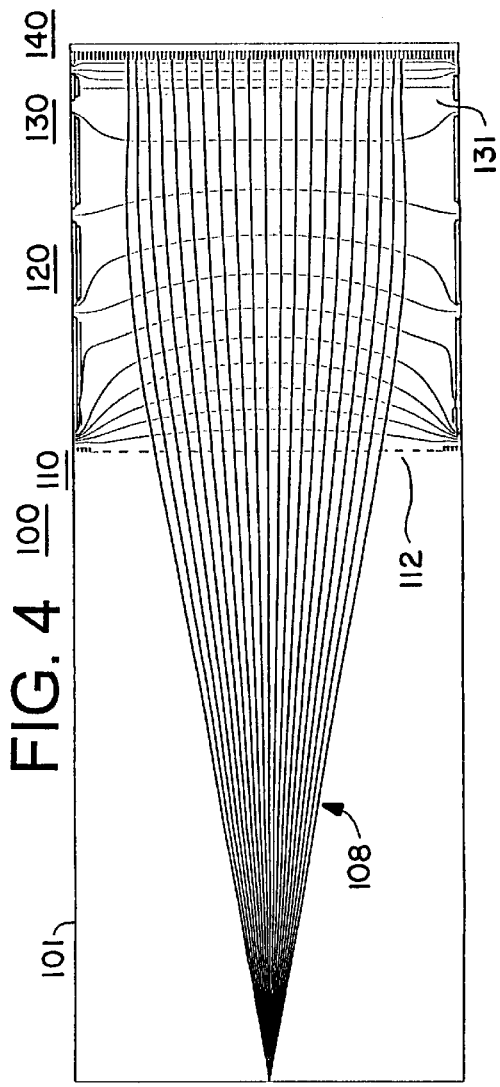
Figure 5:
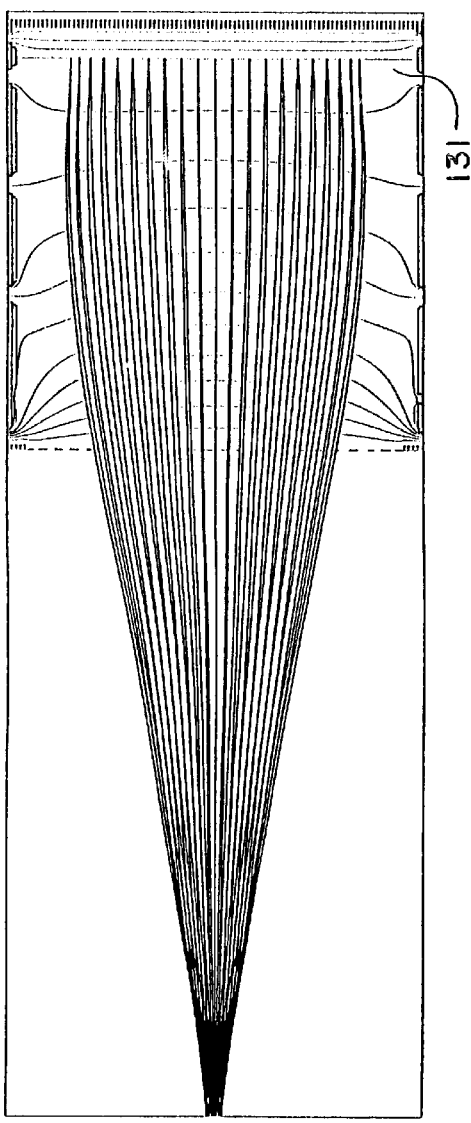
Figure 6:
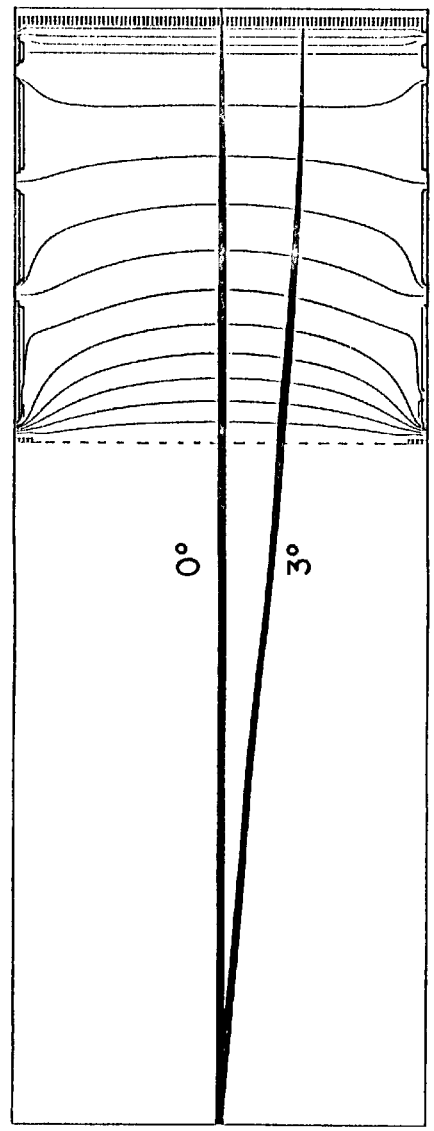
Figure 7:
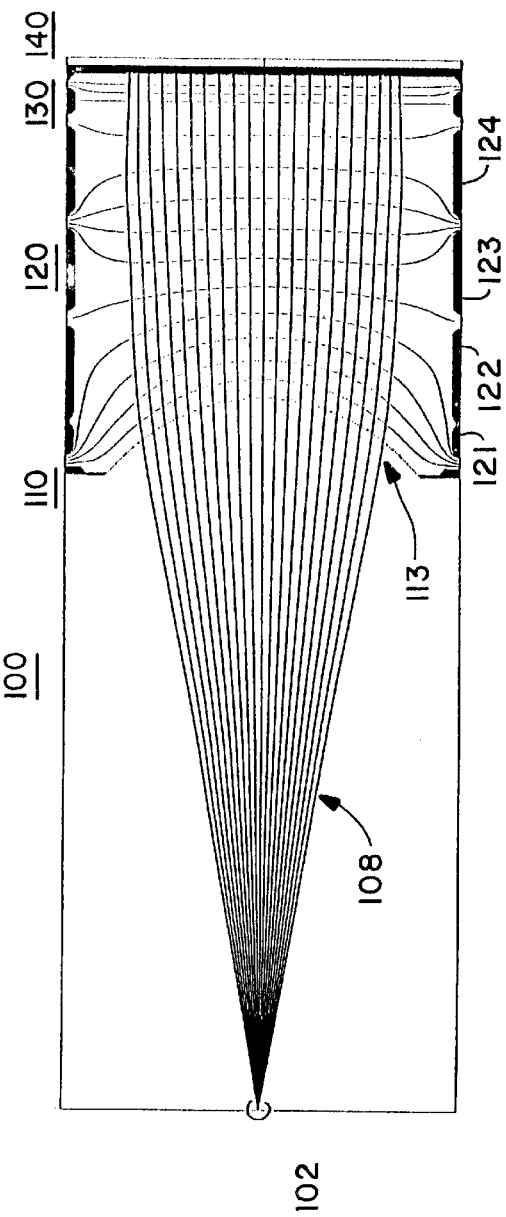

The FIGS. 4 through 6 show a modified embodiment of the invention. The imaging device 100 is essentially identical to the imaging device 100 according to the FIGS. 1 through 3, besides the characteristics of the entrance section 110. Therefore, the same reference numerals are used for the same components.

According to FIG. 4, an essentially planar entrance grid 112 is provided for within the entrance section 110, which extends vertically to the axis of the cylinder-shaped housing 101. The entrance grid 112 is at ground potential, so that on the sample side of the imaging device 100 a field-free space is formed. The entrance grid 112 extends throughout the whole entrance section of the electron beam 108 and is preferably in the form of a rectangular or slanted angled stripe or wire mesh, like the filtering grid 131. Geometric dimensioning of the entrance grid 112 is selected depending on the application. For instance, for a large grid aperture of about 300 μm, high transmission of about 90% results, so that even weak reflexes from the sample may be imaged. But this limits the resolution of the image. In the case of smaller grid apertures up to about 50 μm, the transmission at about 60% is lower, but the resolution of the image improves.

The entrance grid 112 is preferably made as an electrolytically etched plate. The plate is essentially planar, so that the entrance grid 1 12 has deviations from plane aligment of less than about ¹⁄₁₀ mm for the whole grid area.

FIGS. 4 and 5, which are analogous to FIGS. 1 and 2, show the high energy level selectiveness of the imaging unit 100 according to the invention. Electrons being emitted from the above mentioned sample at a voltage of –300 V pass through the filtering grid 131 having an energy level of 10001 eV (see FIG. 4), respectively are reflected by the filtering grid 131 at an energy level of 9999 eV (see FIG. 5).

FIG. 6, which is analogous to FIG. 3, illustrates the improved scattering angle focus using the imaging device 100 according to the invention for an electron beam with scattering angles of 0° and 3°, respectively. Besides this improvement of the imaging quality, the advantage of the embodiment according to FIG. 4 is in the extended angle range for electron imaging. It is possible to image scattering angles of up to +/–10° with excellent focusing characteristics.

Example values for the potentials of the deceleration lenses 121–124 in case of the embodiment according to FIGS. 4 through 6 are –5.5 kV, –7.5 kV, –8.85 kV and –10 kV, respectively. The filtering grid 131 is at a potential of –7 kV.

FIGS. 7 through 11 illustrate further modifications of an imaging device 100 according to the invention, for which in the entrance section 110 a spherical entrance grid 113 with a low spherical radius for smaller angle ranges (FIGS. 7, 8) or a larger spherical radius for large angle ranges of up to +/–23° (FIGS. 9 through 11) is provided for. The spherical grid 113 like the entrance grid 112 for the embodiment explained above consists of a grid with a grid aperture selected depending on the application. It extends on a sphere surface with a spherical radius selected depending on the application in the range of about 50 mm to 150 mm. The spherical entrance grid 113 is mounted axial-symmetrical with respect to the optical axis of the imaging device 100. The grid edge is connected to the inside of the housing by means of a ring-shaped holder 116 on a plane oriented vertically to the optical axis. The vertical distance of the holder 116 from the sample 102 preferably corresponds to triple to quadruple the value of the radius of the spherical entrance grid 113, but may be smaller as well. Advantageously, there is no sensitive dependency of the imaging characteristics of the imaging unit 100 on the sample distance, so that this may vary depending on the application.

The spherical entrance grid 113 at ground potential forms a field-free space on the sample side and defines a first equipotential plane of the first deceleration lens 121 of the deflection section 120.

Example values for the potentials of the deceleration lenses 121–124 are accordingly –4 kV, –5 kV, –8.6 kV and –10 kV, respectively (FIG. 7), or –3 kV, –7 kV, –8.8 kV and –10 kV, respectively (FIG. 9). The filtering grids 131 are in each case at a potential of –7 kV.

A spherical entrance grid is made as follows. A mesh, like it is for instance etched from a plate or film for formation of a plane filtering grid, is applied to a sphere-shaped form and on this, it is stiffened, for instance by coating. Then, the grid mesh now extending on a sphere surface is furnished with a suitable holder on the edge for mounting in the housing.

Figure 8:
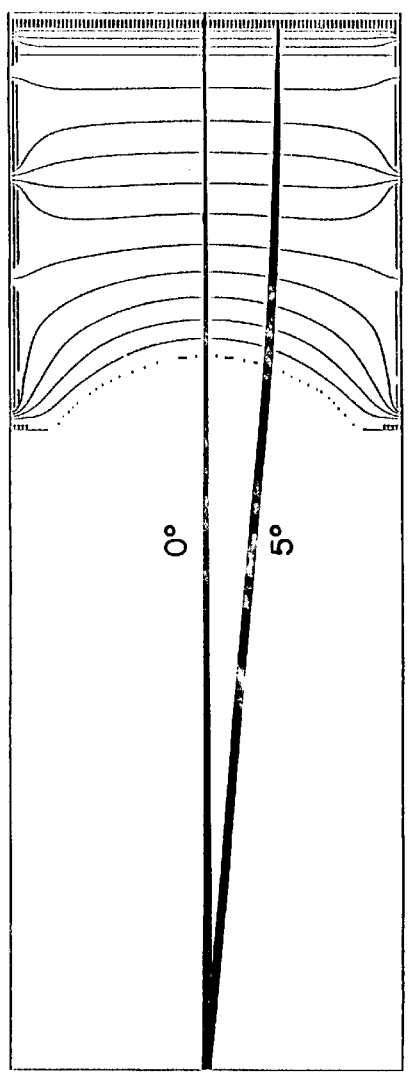
Figure 11:
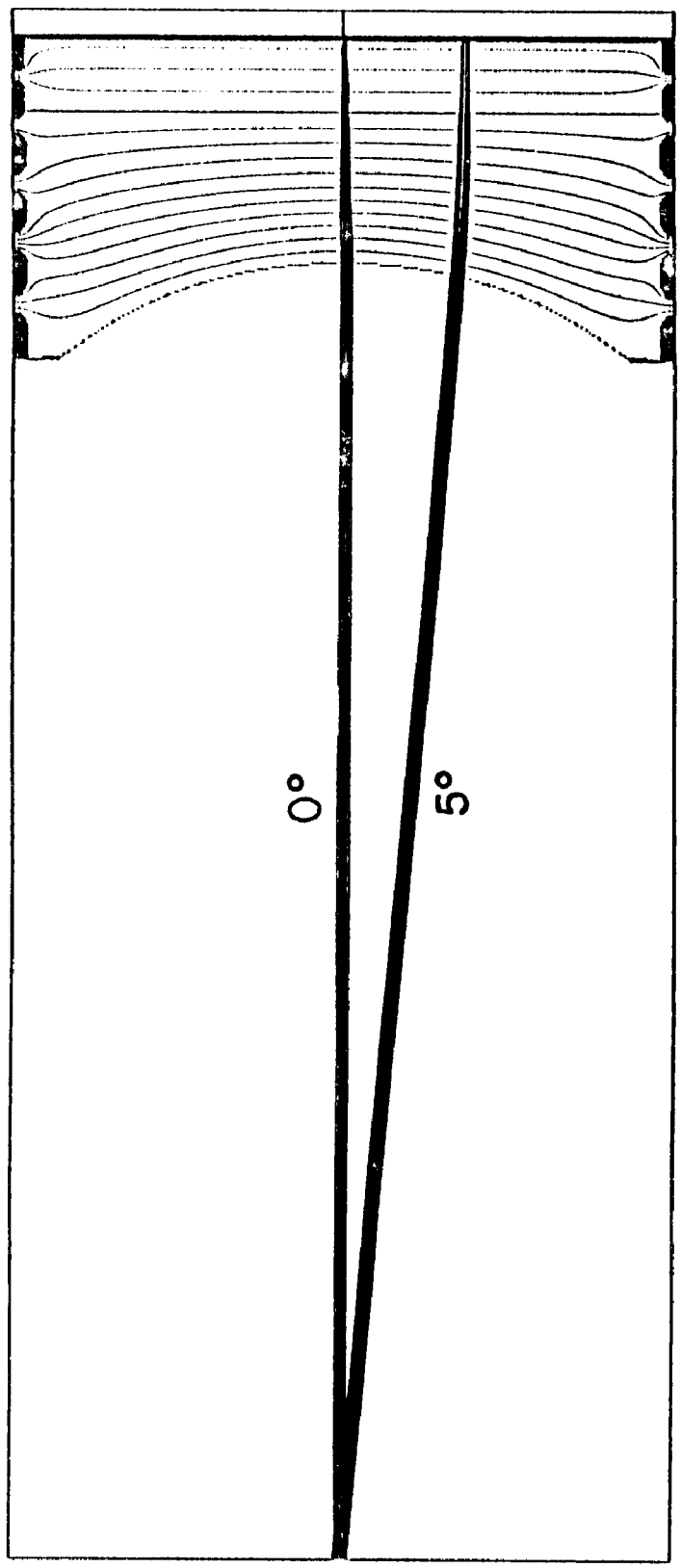

The advantage of fitting of the spherical entrance grid 115 consists in further improvement of the linearity of the image in case of high scattering angles. Distortion is minimized and stray light focusing is improved. This is shown in FIGS. 8 and 11, respectively. Furthermore, the energy selectivity is improved. For instance, FIG. 9 shows the passage of electrons with an energy level of 10006 eV through the filtering grid 131. In case of corresponding imaging of electrons with a lower energy level of for instance 10004 eV, these are reflected at the filtering grid 131 (FIG. 10).

Figure 12:
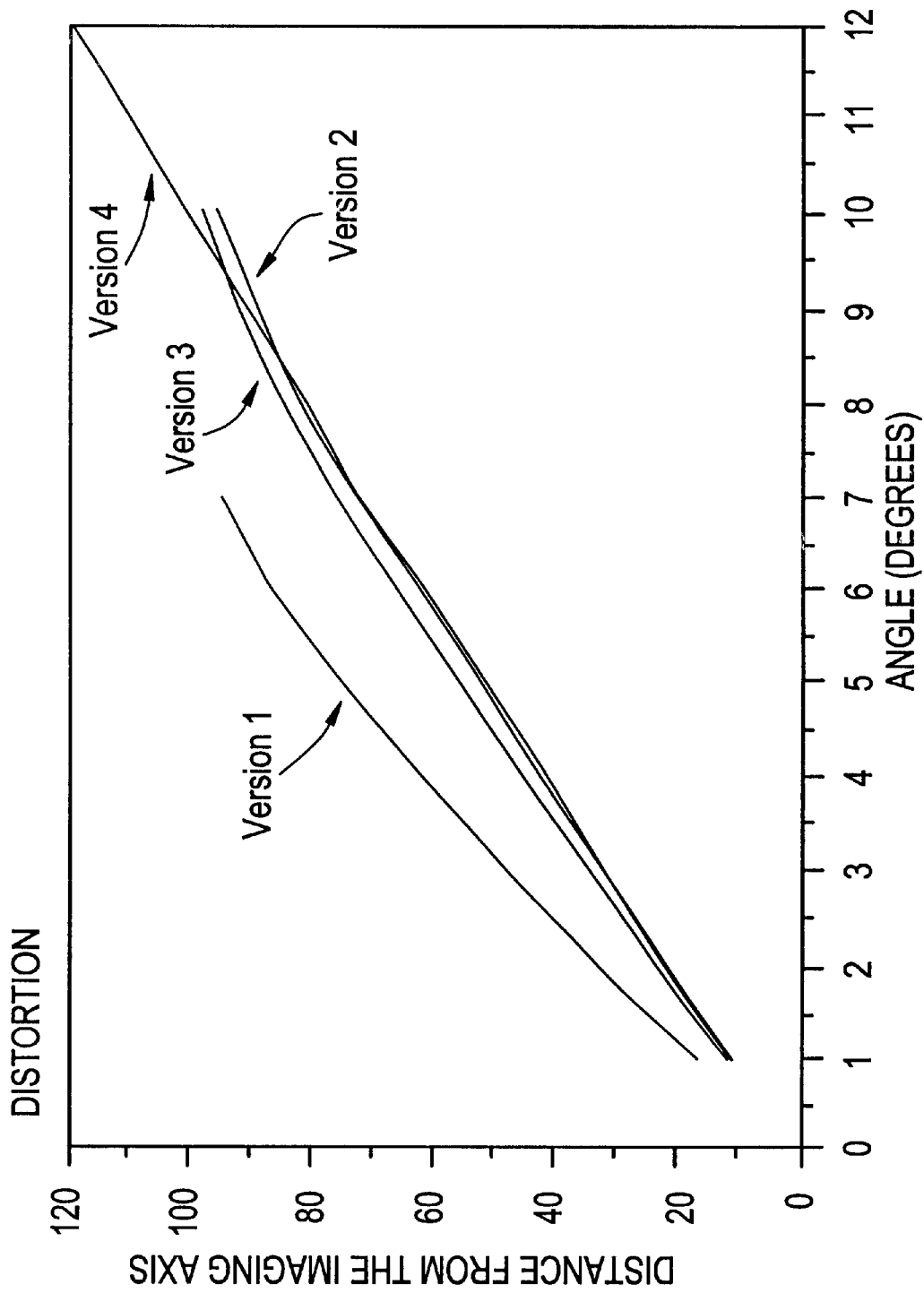

FIG. 12 shows the high quality of imaging of electron beams even in case of high scattering angles. The dependency of distortion on the scattering angle is shown. The curve shapes named version 1 through version 4 correspond to the embodiments explained above according to FIGS. 1, 4, 7 and 9, respectively. The distortion values shown are not achievable with conventional imaging devices.

In the case of electron diffraction investigations, according to the invention, transition may be made to electron beams with grazing incidence, so that a radiation spot in the shape of an ellipse results, which has a lateral dimension in the range of about 300 μm to 1 mm and a more than 5 to 10 fold enlarged longitudinal dimension. Due to excellent scattering angle focusing, all beams running in parallel being emitted from such an illumination spot are focused on one spot, which may be exactly measured in its position due to the spot definition achieved.

Figure 13:
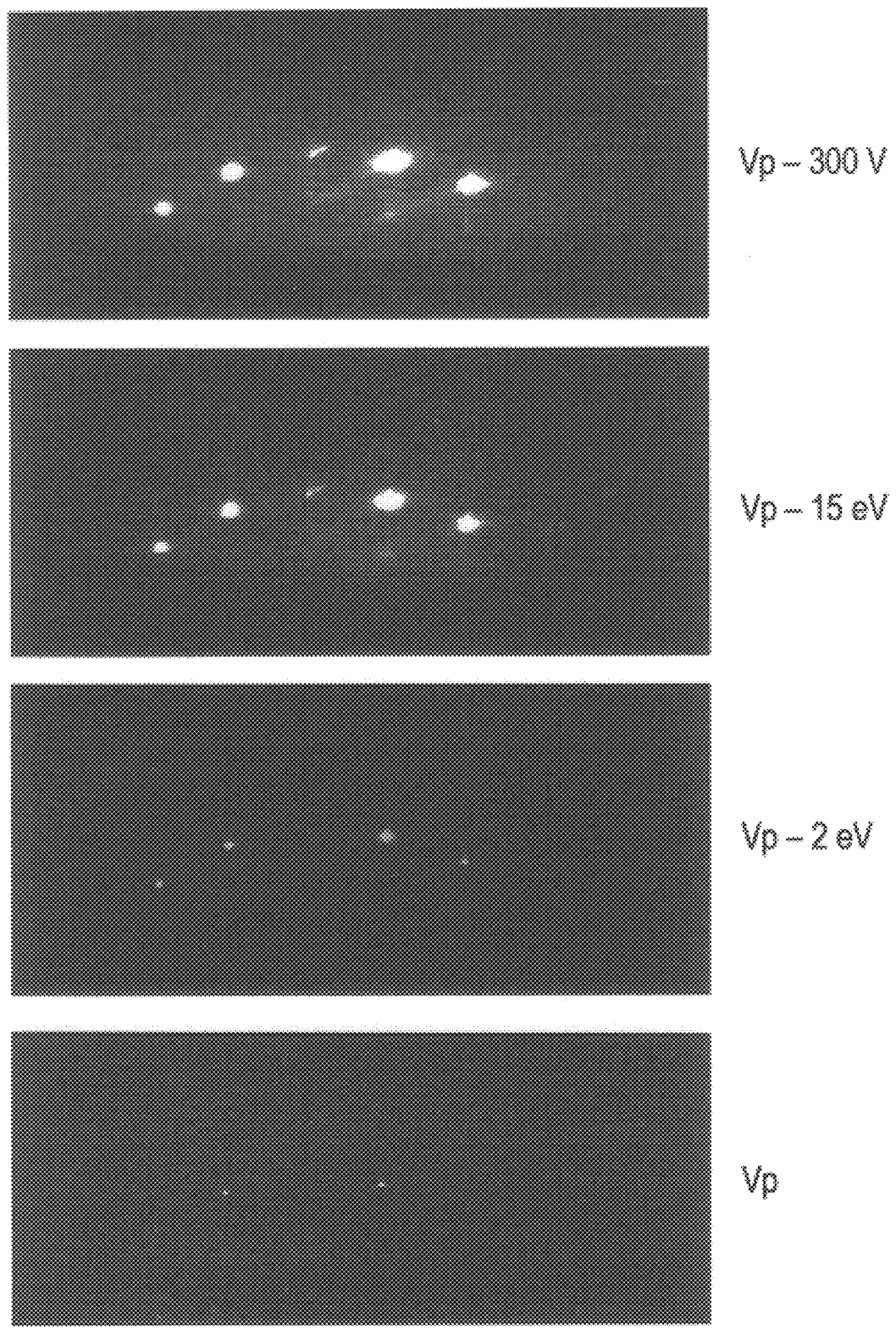

In FIG. 13, a series of images shows energy filtering using an imaging device according to the invention for investigation of electron diffraction by a silicon sample. The (111) surface of the silicon sample is irradiated setting a beam voltage of $V_P$=15000 V and the diffracted electron beam is recorded at scattering angles of +/–10°. This corresponds to a total field of view of 20°. The four individual images show the diffraction pattern for different deceleration potentials of the filtering grid 131 (see above). In detail, deceleration potentials of $V_P$–300 V, $V_P$–15 V, $V_P$–2 V and $V_P$ were set, respectively. Energy filtering not only supplies a clear separation of scattering reflexes from background radiation, but also the opportunity of more exact evaluation of the position of the scattering reflexes.

Figure 14:
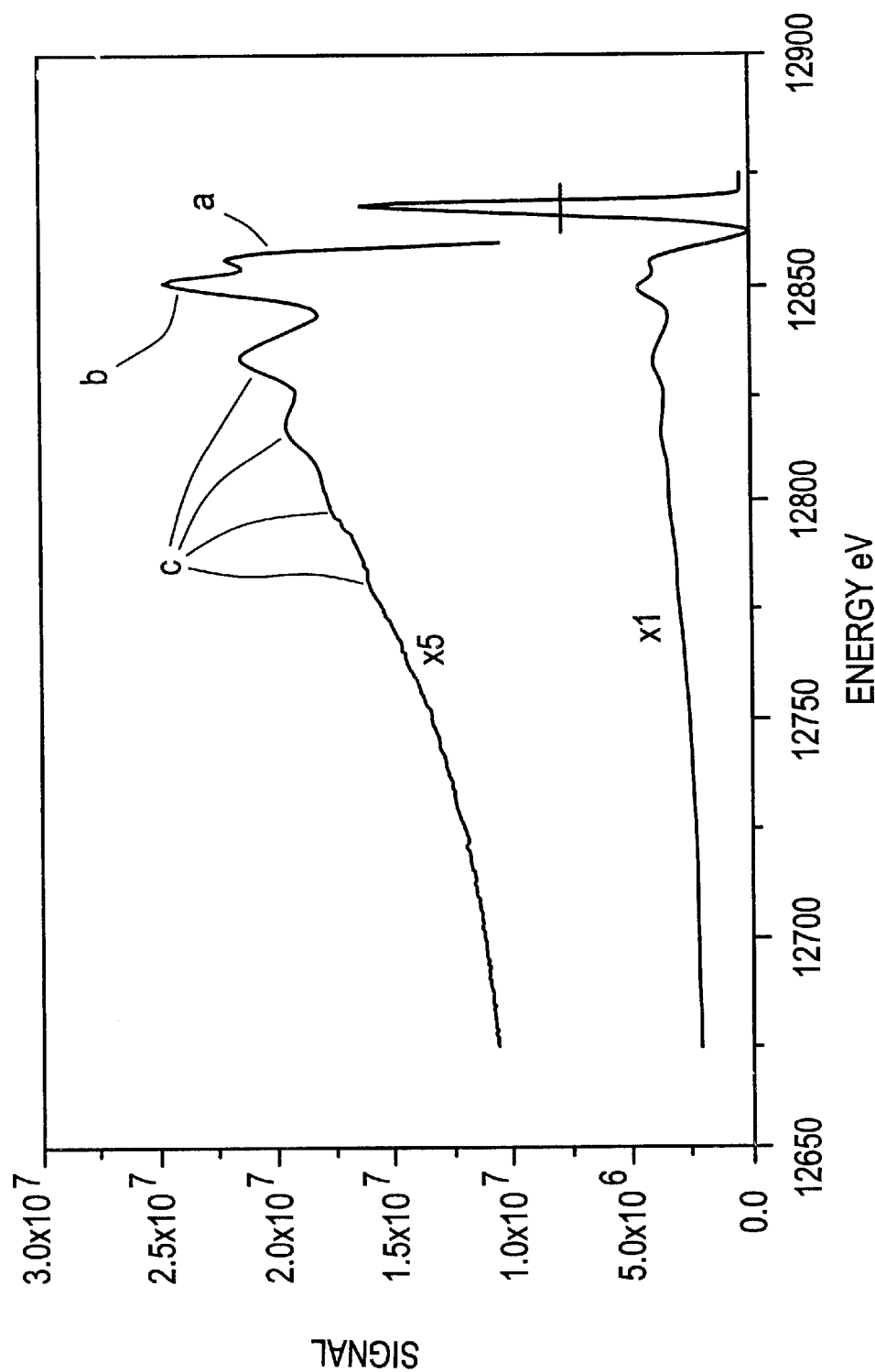

FIG. 14 illustrates an energy loss measurement performed using an imaging device according to the invention for scattering of electrons at the (111) surface of silicon at a temperature of T=585° C. It shows the dependency of the detector signal supplied by the detector for a certain reflex (arbitrary units) from the energy of the scattered electrons. Due to variation of the deceleration potential of the filtering grid 131 with respect to the deflection section 120, the stray portion for the different energy ranges may be recorded. The curve x1 shows an elastic scattering peak with a half-width of 3.4 eV. In the range of non-elastic scattering (curve x5), portions of surface plasmons (a), volume plasmons (b) and multiple scattering losses (c) may be identified.

Figure 15:
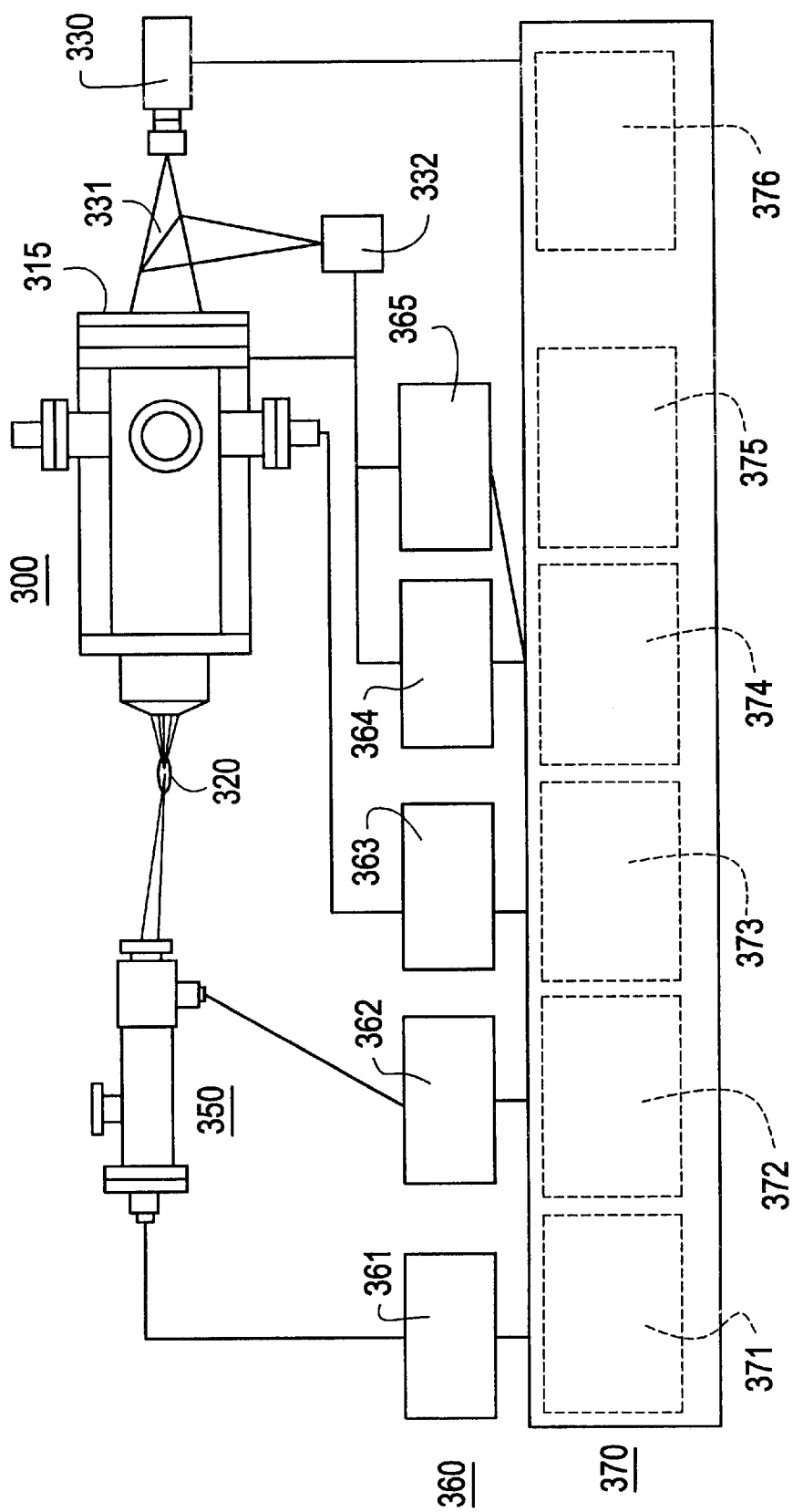
Figure 16:
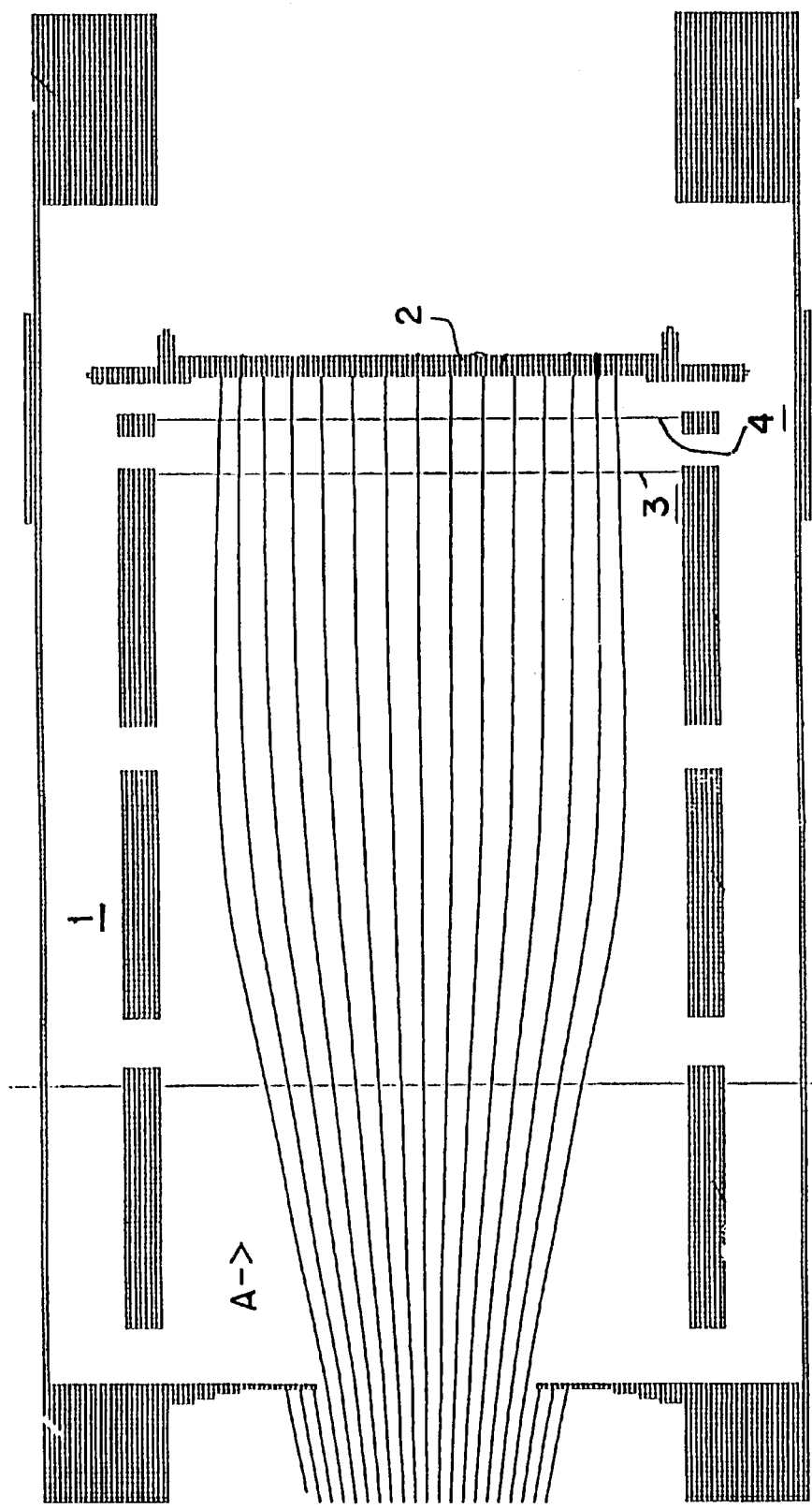

An imaging device according to the invention is preferably mounted on a diffraction spectrometer, which is schematically shown in the overview in FIG. 15. FIG. 15 shows a RHEED apparatus with a RHEED electron source 350, a spectrometer 300 according to the invention, control elements 360 and a data processing unit 370. The electron source 350 is composed in known form and provided for irradiation of the sample 320. The scattered electron beam is recorded by the spectrometer 300, in which an imaging device according to one of the embodiments described above is provided for. The fluorescent screen (here with the reference 315) is simultaneously monitored through two measuring channels. A beam splitter 331 supplies a partial image to image recording using a two-dimensional detector (for instance a CCD camera 330) and a partial image to a fast response dynamic sensor 332 for recording of an integral image signal representing the luminance of the complete diffraction image.

The control elements 360 include a supply unit 361 of the electron source 350, a deflection unit 362 for the electron source 350, a spectrometer control unit 363, a lock-in system 364 and a current amplifier 365. The data processing unit 370, which is preferably implemented as computer control, includes a circuit 371 for providing control signals for the supply unit 361, a circuit 372 for setting irradiation parameters, a circuit 373 for supplying spectrometer control signals, a circuit 374 for lock-in data recording, a circuit 375 for control of growth methods using an MBE device (not shown) and a circuit 376 for image processing and display.

Further details of spectrometer composition according to FIG. 15 are known from DE-OS 197 01 192, which is hereby incorporated by reference into this description with respect to details of the spectrometer and electrode control for electron imaging.

Energy and angle selective imaging of charged particles according to the invention may be modified as follows. Deviations from the compact construction of the imaging device explained above may be realized by embodiments extended in axial direction respectively in beam direction, if for instance the sample due to its temperature or to avoid contamination should be located as far from the detector as possible. Furthermore, within the housing, additional collecting electrodes for recording reflected parts of the electron beam 108, or those deflected by the filtering grid 131, may be provided for, which remove the electrons which should not be imaged. Finally, an imaging device according to the invention may be fitted with a device for shifting the image section as known from DE-OS 197 01 192. Such a device is for instance formed by a deflecting and adjusting coil and has the advantage that selection of the image section may be performed under computer control without compromising the vacuum in the sample chamber.

What is claimed is:

1. A device for imaging a particle beam containing charged particles with a specific energy and angle distribution on a detector, comprising:

a deflecting unit with at least one decelerating lens which forms essentially parallel particle trajectories in the particle beam whose reciprocal distances correspond to an angle distribution of the particles;

a filtering device positioned between the deflecting unit and the detector, wherein the filtering device is biased with a potential for formation of a decelerating field and is energy-selectively transmissive for the particles and an entrance window in the form of an axial-symmetrical staged aperture or an entrance grid located upstream of the deflecting unit, which is electrically insulated against the deflecting unit and is at ground potential.

2. The device according to claim 1, wherein the entrance grid is a planar entrance grid, which is situated vertically with respect to a longitudinal axis extending through the device.

3. The device according to claim 1, wherein the entrance grid is a curved entrance grid having a spherical surface section with a predetermined spherical radius.

4. The device according to claim 3, wherein the distance between a sample, from which the charged particles are emitted, and the spherical entrance grid is about 3- to 4-times the amount of the spherical radius.

5. The device according to claim 1, wherein the entrance grid has grid openings smaller or equal to about 300 μm.

6. The device according to claim 1, wherein the filtering device includes a filtering grid and a space from a last decelerated lens of the deflection unit in beam direction up to the detector is otherwise free of electrodes for particle beam formation.

7. The device according to claim 6, wherein the filtering grid is located so that the particle beam with parallel particle trajectories essentially runs vertically to a plane of the filtering grid.

8. The device according to claim 6, wherein the filtering grid includes mesh apertures smaller or equal to about 300 μm.

9. The device according to claim 6, wherein between a last decelerated lens of the deflection unit in beam direction and the filtering grid a filter deceleration potential is applied, whose amount determines a cut-off energy level, whereby particles with an energy level above the cut-off energy level may pass through the filtering grid.

10. The device according to claim 1, wherein the detector includes an imaging screen for formation of an optical image and sensors for recording the optical image.

11. The device according to claim 1, wherein deceleration potentials of the deceleration lenses and the filtering deceleration potential of the filtering grid are shaped for imaging of electrons, ions, ion beams or charged atom or molecule beams.

12. A spectrometer including an imaging device according to claim 1.

13. A method for imaging a particle beam including charged particles with a specific energy and angle distribution on a detector, comprising passing the particle beam through 1) a deflecting unit with at least one deceleration lens and forming essentially parallel particle trajectories and 2) a filtering device, which is energy-selectively transmissive for the particles, wherein the particle beam entering the deflecting unit is limited by an entrance window in the form of a staged aperture or passes through an entrance grid located on a sample side upstream of the deflecting unit, by means of which a potential-free space is formed upstream of the deflecting unit.

14. The method according to claim 13, wherein the field-free space is limited by a planar or sphere-shaped entrance grid.

15. The method according to claim 13, wherein the particle beam passes through a filtering grid, which is biased with a deceleration potential with respect to a last decelerating lens in beam passage direction for forming a deceleration field with respect to the deflecting unit.

16. The method according to claim 13, applied for energy and angle resolved imaging of electrons, ions, ion beams or charged atom or molecule beams for electron diffraction investigations, for structural analysis by separation of elastic and non-elastic scattering, for angle resolved photo and Auger electron spectroscopy and/or for formation of an electronic mirror for "time of flight" spectroscopy.

* * * * *